(12) United States Patent
Shibuya et al.

(10) Patent No.: US 8,802,496 B2
(45) Date of Patent: Aug. 12, 2014

(54) SUBSTRATE FOR SEMICONDUCTOR PACKAGE AND METHOD OF MANUFACTURING THEREOF

(71) Applicants: Akinobu Shibuya, Tokyo (JP); Akira Ouchi, Tokyo (JP)

(72) Inventors: Akinobu Shibuya, Tokyo (JP); Akira Ouchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/958,989

(22) Filed: Aug. 5, 2013

(65) Prior Publication Data

US 2013/0316495 A1   Nov. 28, 2013

Related U.S. Application Data

(62) Division of application No. 13/383,895, filed as application No. PCT/JP2010/004239 on Jun. 25, 2010, now Pat. No. 8,531,023.

(30) Foreign Application Priority Data

Jul. 17, 2009   (JP) ................................ 2009-168831

(51) Int. Cl.
*H01L 21/56*   (2006.01)
(52) U.S. Cl.
USPC ........... 438/108; 257/778; 257/692; 257/691; 333/246
(58) Field of Classification Search
CPC ................... H01L 2223/6627; H01L 2224/16; H01L 2924/14; H01L 2924/16; H01L 21/563; H01P 11/003; H01P 3/006

USPC .......................... 438/108; 257/778, 691, 692
See application file for complete search history.

(56) References Cited

U.S. PATENT DOCUMENTS

| | | |
|---|---|---|
| 6,787,919 B2 | 9/2004 | Su |
| 7,940,143 B2 | 5/2011 | Chang et al. |
| 2010/0308925 A1 | 12/2010 | Song et al. |
| 2011/0155435 A1 | 6/2011 | Mohammed |
| 2011/0175793 A1 | 7/2011 | Suzuki |
| 2012/0261838 A1 | 10/2012 | Braunisch et al. |

FOREIGN PATENT DOCUMENTS

| | | |
|---|---|---|
| JP | 7-254661 A | 10/1995 |
| JP | 10-92981 A | 4/1998 |
| JP | 2000-31708 A | 1/2000 |
| JP | 2000-357763 A | 12/2000 |
| JP | 2002-026178 A | 1/2002 |

*Primary Examiner* — Tom Thomas
*Assistant Examiner* — John Bodnar
(74) *Attorney, Agent, or Firm* — Sughrue Mion, PLLC

(57) ABSTRACT

Disclosed is a substrate for a semiconductor package in which leakage of radiation noise from a gap between a semiconductor element and a mounting substrate can be prevented. The substrate for the semiconductor package includes a coplanar waveguide including a signal and ground electrodes on the mounting substrate, the signal electrode flip-chip connected to the semiconductor element, the ground electrodes arranged on both sides of the signal electrode with intervals therebetween. A step part is formed in the ground electrodes in an outer circumferential part of a mounting region of the semiconductor element, the step part having a larger distance between upper surfaces of the mounting substrate and the ground electrode in the outer circumferential part of the mounting region than such distance in the mounting region, and an insulator for covering the signal electrode in the outer circumferential part of the mounting region is formed.

3 Claims, 8 Drawing Sheets

SUBSTRATE FOR SEMICONDUCTOR PACKAGE AND METHOD OF MANUFACTURING THEREOF

REFERENCE TO RELATED APPLICATION

This application is a Divisional of U.S. patent application Ser. No. 13/383,895, filed on Jan. 13, 2012, which is a National Stage of International Application No. PCT/JP2010/004239, filed on Jun. 25, 2010, which claims priority from Japanese Patent Application No. 2009-168831, filed on Jul. 17, 2009, the contents of all of which are incorporated herein by reference in their entirety.

TECHNICAL FIELD

The present invention relates to a substrate for a semiconductor package, a semiconductor package, a method of manufacturing the substrate for the semiconductor package, and a method of manufacturing the semiconductor package.

BACKGROUND ART

In recent years, along with high frequency in semiconductor elements, a semiconductor package (a structure in which one semiconductor element is mounted on a substrate for package) and a composite module (a structure in which a plurality of semiconductor elements are mounted on a substrate for module) suitable for transmission of high-frequency signals have been developed. In related arts, a semiconductor package including a semiconductor element connected to a mounting substrate by wire bonding has mainly been used. However, according to such a semiconductor package, it is impossible to sufficiently achieve high frequency characteristic due to inductance components of a wire, and performance of the semiconductor package varies due to manufacturing variations of a wire length. Further, an active surface faces upward (face-up mounting) in the semiconductor element that is connected by wire bonding, which increases radiation noise. Accordingly, a method of covering the semiconductor element with a metal cap for an electromagnetic shield is employed in the semiconductor package in which a semiconductor element of high frequency is face-up mounted.

On the other hand, another semiconductor package is reported that uses a flip-chip connection (face-down mounting) in which a bump is formed in a connection pad of a semiconductor element and the semiconductor element is connected to a mounting substrate so that an active surface of the semiconductor element faces the mounting substrate. According to the flip-chip connection, the semiconductor element and the mounting substrate are connected in a short distance compared to face-up mounting by wire bonding, which can reduce transmission loss of signals. Further, manufacturing variations can be reduced and the device can be manufactured with low cost. Further, since the active surface of the semiconductor element faces the side of the mounting substrate, radiation noise can be made small by providing a ground electrode that is sufficiently wide on the mounting substrate (grounding measure). Another technique to cover a semiconductor element mounted on a mounting substrate with a conductor serving as an electromagnetic shield has been developed as a structure with no metal cap (e.g., see patent literatures 1 and 2).

CITATION LIST

Patent Literature

PTL 1: Japanese Unexamined Patent Application Publication No. 2002-26178

PTL 2: Japanese Unexamined Patent Application Publication No. 10-92981

SUMMARY OF INVENTION

Technical Problem

FIG. 18 is a schematic view showing a schematic structure of a semiconductor package 100 disclosed in a patent literature 1. As shown in FIG. 18, it is required in the semiconductor package 100 that a conductor 103 is configured to be connected to a ground electrode on a surface of a mounting substrate 101 (a surface opposite to a semiconductor element 102). However, other electrodes than the ground electrode including a signal line cannot be provided on the surface of the mounting substrate 101. Accordingly, the mounting substrate 101 in the semiconductor package 100 has a laminated structure of a plurality of layers in which via holes are formed inside so as to draw a signal line to outside (a rear surface of the mounting substrate 101).

Even when the signal line is provided on the surface of the mounting substrate 101, the conductor 103 that serves as an electromagnetic shield cannot be provided on an upper surface of the signal line. Accordingly, radiation noise may leak from a gap between the mounting substrate 101 and the semiconductor element 102 where the conductor 103 cannot be provided.

FIG. 19 is a schematic view showing a schematic structure of a semiconductor package 200 disclosed in a patent literature 2. As shown in FIG. 19, in the semiconductor package 200, a conductor 204 is configured to cover side surfaces of an underfill resin 203 and side surfaces of a semiconductor element 202. In the semiconductor package 200 as well, other electrodes than the ground electrode including a signal line cannot be provided on a surface of a mounting substrate 201, as is similar to the case in the patent literature 1.

The present invention has been made in view of the above-described circumstances. An exemplary object of the present invention is to provide a substrate for a semiconductor package, a semiconductor package, a method of manufacturing the substrate for the semiconductor package, and a method of manufacturing the semiconductor package capable of preventing leakage of radiation noise from a gap between the semiconductor element and the mounting substrate.

Solution to Problem

In order to solve the problems described above, a substrate for a semiconductor package according to the present invention includes: a coplanar waveguide including a signal electrode and ground electrodes on a mounting substrate having a semiconductor element mounted thereon, the signal electrode flip-chip connected to the semiconductor element with a bump therebetween, the ground electrodes arranged on both sides of the signal electrode with intervals therebetween, in which, a step part is formed in the ground electrodes in an outer circumferential part of a mounting region of the semiconductor element, the step part having a larger distance between an upper surface of the mounting substrate and an upper surface of the ground electrode in the outer circumferential part of the mounting region than such distance in the mounting region, and an insulator for covering the signal electrode in the outer circumferential part of the mounting region is formed.

Advantageous Effects of Invention

According to the present invention, a step part is formed in the ground electrodes in the outer circumferential part of the mounting region of the semiconductor element on the mounting substrate. Further, the insulator is formed to cover the signal electrode in the outer circumferential part of the mounting region. Accordingly, when the semiconductor element is mounted on the mounting substrate, radiation noise generated from the active surface of the semiconductor element is shielded by the step part which serves as an electromagnetic shield wall formed in the outer circumferential part of the mounting region on the mounting substrate. In summary, since the surface (surface in the side of the semiconductor element) of the mounting substrate is not flat, radiation noise can be prevented from being propagated along the surface of the mounting substrate. Further, when a conductor is formed as an electromagnetic shield which covers the semiconductor element, the ground electrode and the insulator can be used as the bases so that the conductor does not contact the signal electrode. Further, the conductor can be formed on the ground electrode and the insulator without any gap. Accordingly, when the semiconductor element is mounted on the mounting substrate, radiation noise can be prevented from being leaked from a gap between the semiconductor element and the mounting substrate.

DESCRIPTION OF EMBODIMENTS

Hereinafter, with reference to the drawings, exemplary embodiments of the present invention will be described. Each of these exemplary embodiments shows one exemplary aspect of the present invention, and is not intended to limit the present invention but may be changed as appropriate within the range of the technical scope of the present invention. Further, in the accompanying drawings, the scale, the number and the like in each structure are different from those in the actual structure for the sake of clarity of each structure.

(Substrate for Semiconductor Package)

First Embodiment

Figure 1:
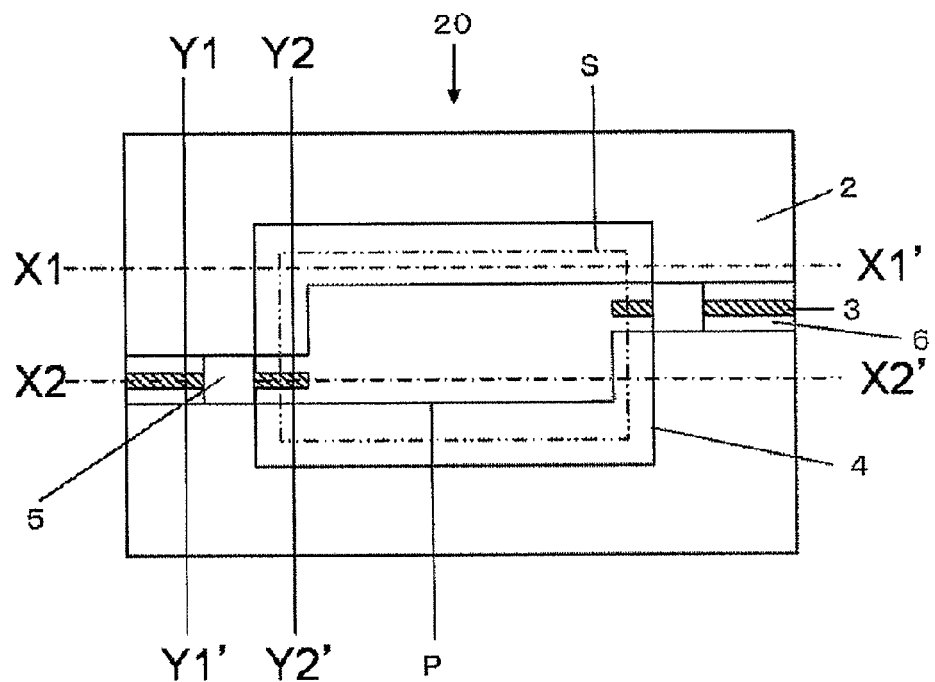
FIG. 1 is a plane view showing a substrate for a semiconductor package according to the present invention.
Figure 2:
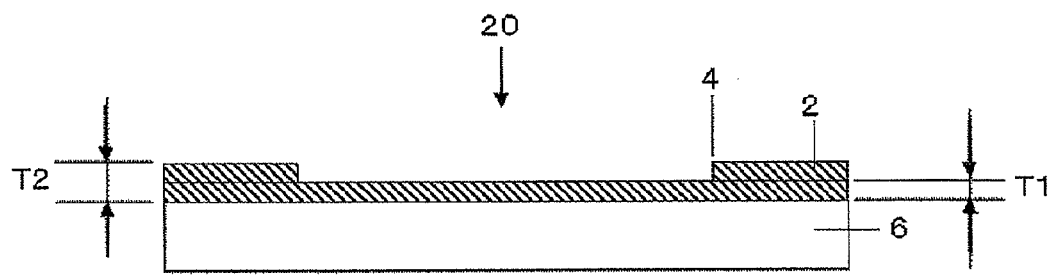
FIG. 2 is a cross-sectional view taken along the line X1-X1' of FIG. 1.
Figure 3:
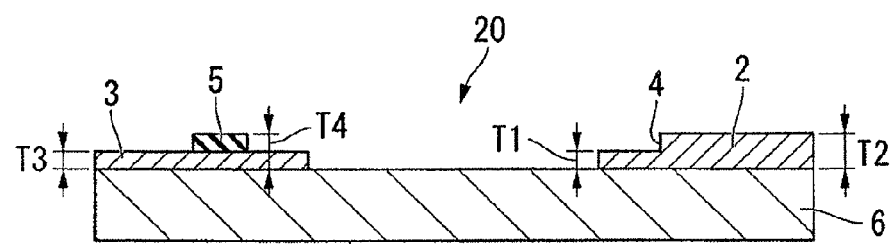
FIG. 3 is a cross-sectional view taken along the line X2-X2' of FIG. 1.
Figure 4:
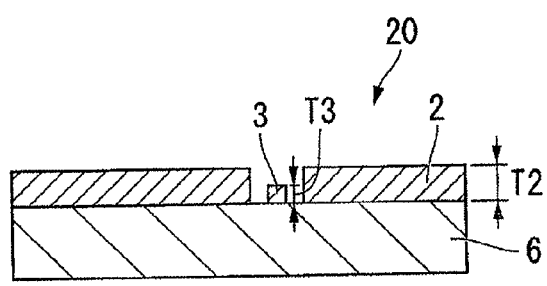
FIG. 4 is a cross-sectional view taken along the line Y1-Y1' of FIG. 1.
Figure 5:
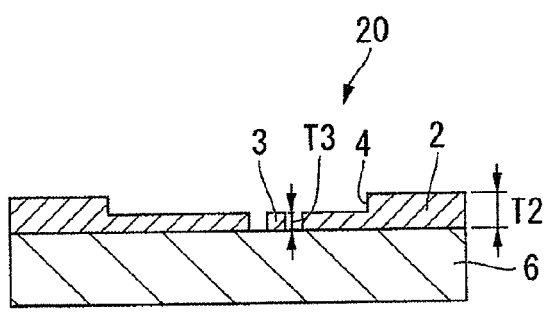
FIG. 5 is a cross-sectional view taken along the line Y2-Y2' of FIG. 1.

FIGS. 1 to 5 are schematic views showing a substrate for a semiconductor package 20 according to a first embodiment of the present invention. FIG. 1 is a plane view showing the substrate for the semiconductor package 20. FIG. 2 is a cross-sectional view taken along the line X1-X1' of FIG. 1. FIG. 3 is a cross-sectional view taken along the line X2-X2' of FIG. 1. FIG. 4 is a cross-sectional view taken along the line Y1-Y1' of FIG. 1. FIG. 5 is a cross-sectional view taken along the line Y2-Y2' of FIG. 1.

As shown in FIG. 1, the substrate for the semiconductor package 20 according to the first embodiment is formed in a rectangular shape in a plane view, and a signal electrode 3 and ground electrodes 2 are formed on a mounting substrate 6. On the mounting substrate 6, the ground electrodes 2 are arranged on both sides of the signal electrode 3 with intervals from the signal electrode 3, and the signal electrode 3 and the ground electrodes 2 form a coplanar waveguide (CPW). A mounting region S in which a semiconductor element 7 described below (see FIG. 6) is mounted is arranged in the center on the mounting substrate 6. Further, a punched pattern P (opening region) which is formed in a rectangular shape in a plane view is formed in the mounting region S in the coplanar waveguide on the mounting substrate 6. An outer circumferential part of the punched pattern P in the mounting region S serves as a connection region where the semiconductor element 7 is connected to electrodes (signal electrode 3 and ground electrodes) with bumps 9 described below (see FIG. 7) therebetween. Further, a step part 4 is formed in the ground electrodes 2 in an outer circumferential part of the mounting region S on the mounting substrate 6. While the ground electrodes 2 and the signal electrode 3 are shown as a coplanar waveguide on the mounting substrate 6 for the sake of convenience of description, other electrodes such as a power supply electrode may be provided.

In the first embodiment, the coplanar waveguide is used on the mounting substrate 6, thereby capable of transmitting high-frequency signals while suppressing transmission loss. Specifically, since the signal electrode 3 and the ground electrodes 2 are concentrated in an element forming surface (a surface in a side where the semiconductor element 7 is mounted) of the mounting substrate 6, which eliminates electrodes on a surface opposite to the element forming surface. Thus, there is no need to provide a via hole to electrically connect the ground electrodes 2 and the signal electrode 3 to the mounting substrate 6. Accordingly, high-frequency signals can be transmitted without using the via hole, which can reduce transmission loss.

The substrate used for the mounting substrate 6 is not particularly limited. For example, a printed board, an organic substrate, a ceramic substrate may be used. Preferably, a printed board formed mainly of polyphenylene ether (PPE), which has low dielectric loss in high frequency, a liquid crystal polymer (LCP) substrate, and a low temperature co-fired ceramic (LTCC) substrate may be used.

Further, the material of the electrodes is not particularly limited. Preferably, for example, copper (Cu) is used for the organic substrate, and silver-palladium (Ag—Pd) alloy is used for the LTCC substrate. Further, the surface treatment performed on the electrodes is not particularly limited as well. In the first embodiment, gold (Au) plating processing, which is suitable for flip-chip connection of the semiconductor element 7, is performed on a nickel (Ni) plating barrier serving as an base.

As shown in FIG. 2, the step part 4 is formed so that a thickness T2 (a distance between an upper surface of the mounting substrate 6 and an upper surface of the ground electrode 2 in the outer circumferential part of the mounting region S) of the ground electrode 2 in the side opposite to the mounting region S becomes larger than a thickness T1 (a distance between the upper surface of the mounting substrate 6 and the upper surface of the ground electrode 2 in the mounting region S) of the ground electrode 2 in the side of the mounting region S (T1<T2).

Accordingly, it is possible to prevent radiation noise from being leaked from a gap between the semiconductor element 7 and the mounting substrate 6 when the semiconductor element 7 is mounted above the mounting substrate 6. More specifically, radiation noise occurred from an active surface of the semiconductor element 7 is shielded by the step part 4 that serves as an electromagnetic shield wall formed in the outer circumferential part of the mounting region S on the mounting substrate 6. Accordingly, since the surface of the mounting substrate 6 is not flat, the radiation noise can be prevented from propagating along the surface of the mounting substrate 6.

Although the height (T2-T1) of the step part 4 is not particularly limited, it is required that the step part has such a height (height of a part serving as a dam) as to prevent an underfill resin 10 (see FIG. 7) from flowing out when the underfill resin 10 is formed. In the first embodiment, the height (T2-T1) of the step part 4 is set within a range of between 10 μm and 30 μm.

As shown in FIGS. 3 to 5, a thickness T3 (a distance between the upper surface of the mounting substrate 6 and an upper surface of the signal electrode 3) of the signal electrode 3 is substantially the same to the thickness T1 of the ground electrode 2 in the side of the mounting region S for the whole area on the mounting substrate 6.

In the outer circumferential part of the mounting region S on the mounting substrate 6, an insulator 5 is formed to cover the signal electrode 3. Accordingly, the ground electrodes 2 and the insulator 5 can be used as bases so as to prevent a conductor 8 (see FIG. 6) from being contacted with the signal electrode 3 when the conductor 8 is formed as an electromagnetic shield that covers the semiconductor element 7. Furthermore, after the semiconductor element 7 is mounted, the conductor 8 may be formed on the ground electrode 2 and the insulator 5 without any gap.

A thickness T4 (a distance between the upper surface of the mounting substrate 6 and an upper surface of the insulator 5) of the insulator 5 is the same to the thickness T2 of the ground electrode 2 in the outer circumferential part of the mounting region S (T4=T2). Thus, the upper surface of the insulator 5 and the upper surface of the ground electrode 2 become flat, which makes it possible to form the conductor 8 on the insulator 5 and the ground electrode 2 that serve as the bases without unevenness when the conductor 8 is formed after the semiconductor element 7 is mounted.

Although the thickness T4 (the distance between the upper surface of the mounting substrate 6 and the upper surface of the insulator 5) of the insulator 5 is not particularly limited, it is required that the insulator 5 has such a height as to serve as a dam, as is similar to the height (T2-T1) of the step part 4. In the first embodiment, the thickness T4 of the insulator 5 is set within a range of between 10 μm and 30 μm. Further, the material of the insulator 5 is not particularly limited. Preferably, however, for example, a solder resist material is used for the organic substrate, and a substrate material is used for the LTCC substrate.

Further, the step part 4 and a side surface part of the insulator 5 in the side facing the mounting region S are contacted. Accordingly, the surfaces of the whole part of the insulator 5 and the step part 4 in the side of the mounting region S become flat, which makes it possible to definitely prevent leakage of the underfill resin 10 from the dam when the underfill resin 10 is formed after the semiconductor element 7 is mounted.

Further, the insulator 5 is formed to fill the gap between the signal electrode 3 and the ground electrode 2 on the mounting substrate 6 in the outer circumferential part of the mounting region S. Accordingly, the ground electrode 2 and the insulator 5 covering the signal electrode 3 are formed without any gap, which makes it possible to prevent the conductor 8 from flowing through the gap to contact the signal electrode 3 when the conductor 8 is formed after the semiconductor element 7 is mounted. Further, the conductor 8 may be definitely formed on the insulator 5 and the ground electrode 2 without any gap.

Semiconductor Package

Figure 6:
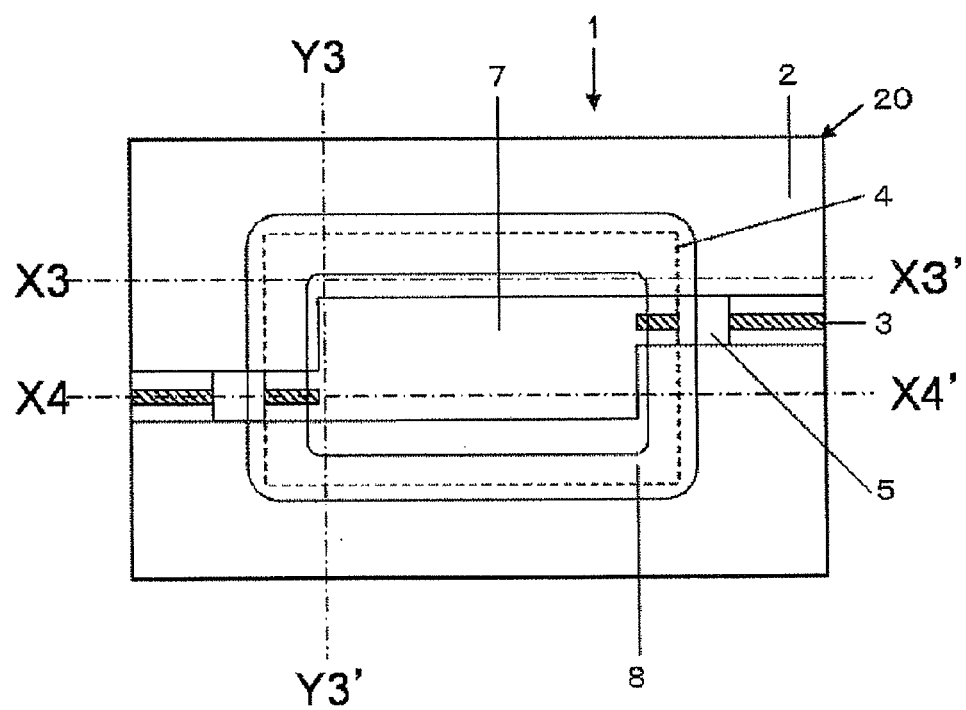
FIG. 6 is a plane view showing a semiconductor package according to a first embodiment of the present invention.
Figure 7:
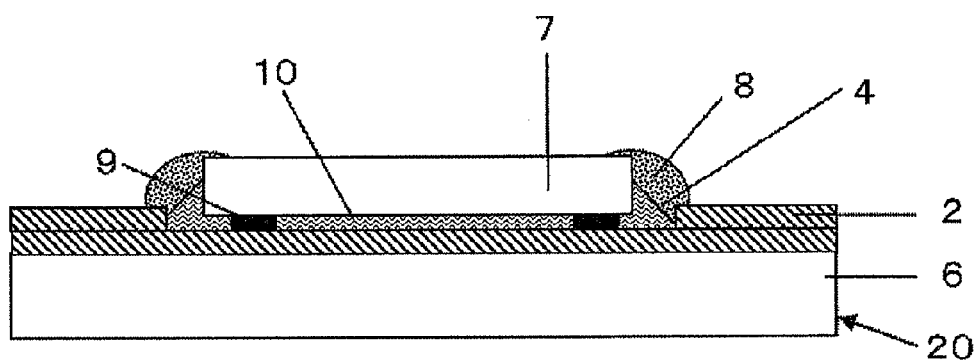
FIG. 7 is a cross-sectional view taken along the line X3-X3' of FIG. 6.
Figure 8:
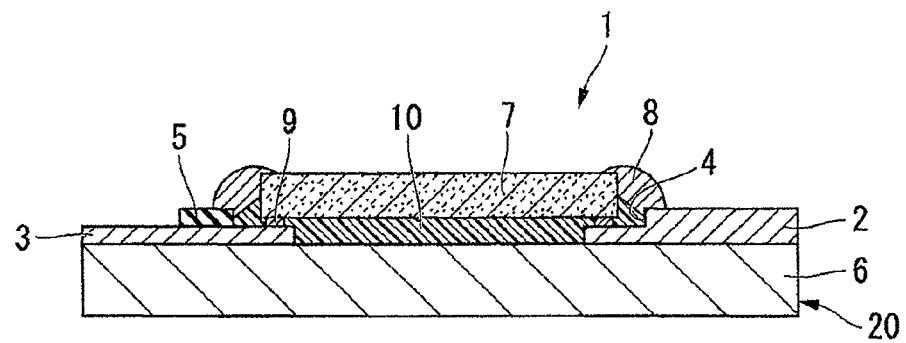
FIG. 8 is a cross-sectional view taken along the line X4-X4' of FIG. 6.
Figure 9:
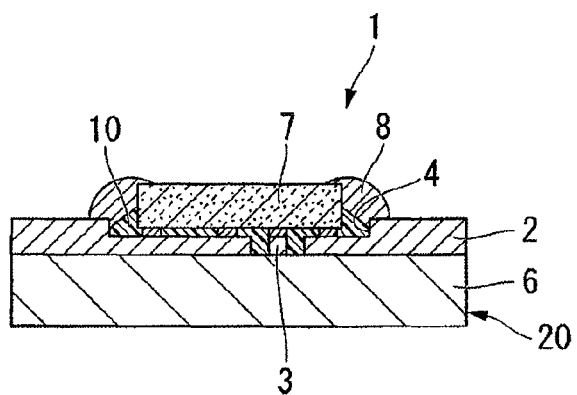
FIG. 9 is a cross-sectional view taken along the line Y3-Y3' of FIG. 6.

FIGS. 6 to 9 are schematic views showing the semiconductor package 1 according to the first embodiment of the present invention. FIG. 6 is a plane view showing the semiconductor package 1. FIG. 7 is a cross-sectional view taken along the line X3-X3' of FIG. 6. FIG. 8 is a cross-sectional view taken along the line X4-X4' of FIG. 6. FIG. 9 is a cross-sectional view taken along the line Y3-Y3' of FIG. 6.

As shown in FIGS. 6 to 9, the semiconductor package 1 according to the first embodiment is fixed to the substrate for the semiconductor package 20 stated above with the bumps 9 therebetween, with a circuit forming surface (active surface) of the semiconductor element 7 down. The material of the bump 9 is not particularly limited. Preferably, however, a gold (Au) stud bump or a solder bump is used. Further, the type and the size of the semiconductor element 7, and the size and the pitch of the bump 9 are not particularly limited.

The semiconductor package 1 includes the step part 4 formed in the ground electrodes 2 and the insulator 5 formed to cover the signal electrode 3 in the outer circumferential part of the mounting region S in the substrate for the semiconductor package 20 described above. Accordingly, radiation noise generated from the active surface of the semiconductor element 7 is shielded by the step part 4 that serves as the electromagnetic shield wall formed in the outer circumferential part of the mounting region S on the mounting substrate 6.

Further, the gap between the semiconductor element 7 and the mounting substrate 6 is filled with the underfill resin 10, whereby the semiconductor package 1 is firmly fixed. The underfill resin 10 is formed to the position that reaches the side surfaces of the insulator 5 and the step part 4 of the ground electrode 2 (surface in the side of the mounting region S), and fills the gap between the semiconductor element 7 and the mounting substrate 6. The contractile force of the underfill resin 10 strengthens the connection states of the bumps 9, and makes the thickness (a distance between the upper surface of the electrode and the circuit forming surface of the semiconductor element 7) of the bumps 9 small. Accordingly, the transmission loss of the high-frequency signals can be reduced.

The material of the underfill resin 10 is not particularly limited. Preferably, however, a material that exhibits a small difference in thermal expansion from the semiconductor element 7, and is formed of a composite of an inorganic filler and an organic resin is used. The underfill resin 10 needs to be sufficiently injected without generation of any void even when pitches of input/output terminals of the semiconductor element 7 is miniaturized to 150 µm or less and the distance between the bumps 9 is short, for example. Further, the underfill resin 10 needs to be injected so as not to damage the semiconductor element 7 and the mounting substrate 6. From these points of view, the present inventor has found that a material formed of a composite of an inorganic filler (maximum grain size: 5 µm or less, 40-60 wt %) and an organic resin is suitable as the material of the underfill resin 10.

The conductor 8 is formed in a closed circular shape in a plane view, and is electrically connected to the ground electrodes 2. More specifically, the conductor 8 is formed to cover the whole part where the underfill resin 10 is exposed across the semiconductor element 7 and the mounting substrate 6 (the step part 4 and the insulator 5). Accordingly, it is possible to prevent radiation noise from being leaked from the fine gaps inside the underfill resin 10 and the boundary between the active surface of the semiconductor element 7 and the underfill resin 10.

Although the material of the conductor 8 is not particularly limited, silver paste, which is a composite of silver (Ag) filler and epoxy resin, may be used, for example.

(Manufacturing Method of Substrate for Semiconductor Package)

Figure 10:
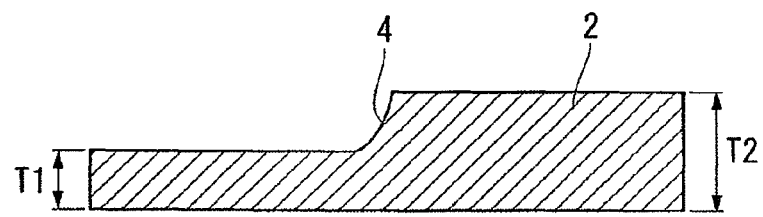
FIG. 10 is a process diagram showing a manufacturing process of the semiconductor package according to the present invention.
Figure 11:
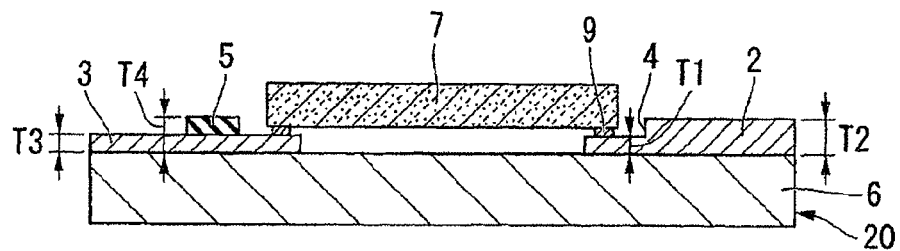
FIG. 11 is a process diagram following FIG. 10.
Figure 12:
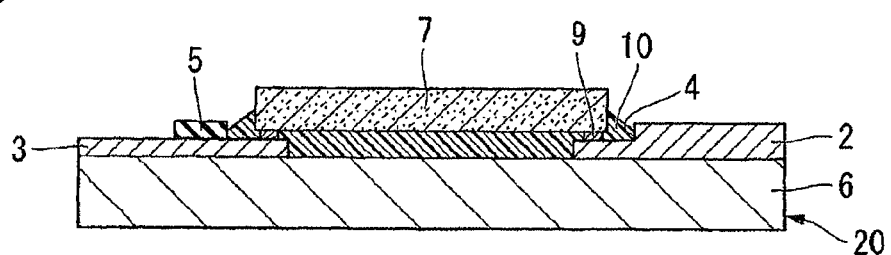
FIG. 12 is a process diagram following FIG. 11.

Next, a manufacturing method of the substrate for the semiconductor package 20 in the semiconductor package 1 according to the first embodiment will be described with reference to FIGS. 10 to 12, and 8. FIGS. 10 to 12 are process diagrams sequentially showing manufacturing processes of the substrate for the semiconductor package 20. FIG. 10 is an enlarged view when the step part 4 is formed in the ground electrodes 2. Further, FIGS. 11 and 12 are cross-sectional views corresponding to FIG. 8 (cross-sectional views taken along the line X4-X4' of FIG. 6).

First, the signal electrode 3 and the ground electrodes 2 are formed by patterning electrodes formed in the upper surface of the mounting substrate 6. More specifically, by forming the ground electrodes 2 on both sides of the signal electrode 3 with intervals therebetween on the upper surface of the mounting substrate 6, the coplanar waveguide is formed by the signal electrode 3 and the ground electrodes 2.

Next, a mask is formed on the ground electrode 2 in the outer circumferential part (a part in which the thickness of the ground electrode 2 is desired to be made large) of the mounting region S. Next, the step part 4 is formed by etching the ground electrode 2 where the surface is exposed since the mask is not formed. The step part 4 is formed so that the thickness T2 of the ground electrode 2 which is the side opposite to the side of the mounting region S becomes larger than the thickness T1 of the ground electrode 2 in the side of the mounting region S (T1<T2). The height (T2-T1) of the step part 4 is required to be such a height (height as a dam) as to prevent the underfill resin 10 from flowing out when the underfill resin 10 is formed after the semiconductor element 7 is mounted, and is set to a range of between 10 µm and 30 µm (see FIG. 10). Note that the thickness T3 of the signal electrode 3 is set to substantially identical to the thickness T1 of the ground electrode 2 in the side of the mounting region S for the whole area on the mounting substrate 6.

Next, surface treatment is performed on the ground electrode 2 and the signal electrode 3. Specifically, in order to flip-chip connect the semiconductor element 7, a nickel (Ni) plating barrier is applied on the upper surface of the ground electrode 2 and the signal electrode 3 as bases thereon, and gold (Au) plating processing is further performed thereon.

Next, the insulator 5 is formed to cover the signal electrode 3 in the outer circumferential part of the mounting region S on the mounting substrate 6. The insulator 5 is formed so that the surface in the side of the mounting region S of the step part 4 formed in the ground electrodes 2 and the surface in the side of the mounting region S of the insulator 5 are in the identical surface. The thickness T4 of the insulator 5 is required to have such a height as to serve as a dam as is similar to the height (T2-T1) of the step part 4, and is set to a range of between 10 µm and 30 µm. Further, the insulator 5 is formed to fill the gap between the ground electrode 2 and the signal electrode 3 on the mounting substrate 6 in the outer circumferential part of the mounting region S. From the above processes, the substrate for the semiconductor package 20 described above is manufactured (see FIG. 11).

(Manufacturing Method of Semiconductor Package)

Next, the semiconductor element 7 is flip-chip mounted on the substrate for the semiconductor package 20 manufactured by the above processes with the bumps 9 therebetween (see FIG. 11).

Next, as shown in FIG. 12, the gap between the semiconductor element 7 and the mounting substrate 6 is filled with the underfill resin 10 using a dispenser. At this time, it is possible to prevent the underfill resin 10 from flowing outside by the function as dams of the insulator 5 and the step part 4 in the outer circumferential part of the mounting region S on the mounting substrate 6.

Next, as shown in FIG. 8, the conductor 8 is formed so as to cover the whole part where the underfill resin 10 is exposed across the semiconductor element 7 and the mounting substrate 6 (the step part 4 and the insulator 5). Accordingly, it is possible to prevent radiation noise from being leaked from the fine gaps inside the underfill resin 10 and the boundary between the active surface of the semiconductor element 7 and the underfill resin 10.

The conductor 8 is preferably formed by printing conductive paste described above using a printed method including screen printing or pad printing, for example. Since the upper surface of the insulator 5 and the upper surface of the step part 4 in the outer circumferential part of the mounting region S on the mounting substrate 6 are flat, the conductive paste can be preferably printed. Further, the conductor 8 can be formed with a high yield rate by using a simple printed method, which makes it possible to reduce manufacturing cost of the semiconductor package 1.

According to the substrate for the semiconductor package 20, the semiconductor package 1, the manufacturing method of the substrate for the semiconductor package 20, and the manufacturing method of the semiconductor package 1 of the first embodiment, the step part 4 is formed in the ground electrodes 2 in the outer circumferential part of the mounting region S on the mounting substrate 6, and the insulator 5 is formed to cover the signal electrode 3 in the outer circumferential part of the mounting region S. Accordingly, when the semiconductor element 7 is mounted above the mounting substrate 6, radiation noise generated from the active surface of the semiconductor element 7 is shielded by the step part 4 which serves as the electromagnetic shield wall formed in the outer circumferential part of the mounting region S on the mounting substrate 6. In short, since the surface of the mounting substrate 6 (surface in the side of the semiconductor element 7) is not flat, there is no case that the radiation noise propagates along the surface of the mounting substrate 6. Further, when the conductor 8 is formed as the electromagnetic shield that covers the semiconductor element 7, the ground electrode 2 and the insulator 5 may be used as the bases so that the conductor 8 does not contact with the signal electrode 3. Further, the conductor 8 may be formed on the insulator 5 and the ground electrode 2 without any gap.

Accordingly, it is possible to prevent radiation noise from being leaked from the gap between the semiconductor element 7 and the mounting substrate 6 when the semiconductor element 7 is mounted above the mounting substrate 6.

Further, since the thickness T4 of the insulator 5 is the same to the thickness T2 of the ground electrode 2 in the outer circumferential part of the mounting region S (T4=T2), the upper surface of the insulator 5 and the upper surface of the ground electrode 2 become flat. Accordingly, the conductor 8 can be formed on the insulator 5 and the ground electrode 2 serving as the bases and having flat upper surfaces without unevenness when the conductor 8 is formed after the semiconductor element 7 is mounted. Accordingly, the conductor 8 may be formed definitely on the insulator 5 and the ground electrode 2 without any gap. Accordingly, it is possible to definitely prevent radiation noise from being leaked from the gap between the semiconductor element 7 and the mounting substrate 6 when the semiconductor element 7 is mounted above the mounting substrate 6.

Further, since the step part 4 and the side surface part of the insulator 5 in the side facing the mounting region S are contacted, the surfaces of the whole part of the insulator 5 and the step part 4 in the side of the mounting region S become flat. Thus, the underfill resin 10 can be definitely prevented from flowing from the dam when the underfill resin 10 is formed after the semiconductor element 7 is mounted. Thus, the conductor 8 can be formed on the underfill resin 10 without any gap. Accordingly, it is possible to definitely prevent radiation noise from being leaked from the gap between the semiconductor element 7 and the mounting substrate 6 when the semiconductor element 7 is mounted above the mounting substrate 6.

Further, the insulator 5 is formed to fill the gap between the ground electrode 2 and the signal electrode 3 on the mounting substrate 6 in the outer circumferential part of the mounting region S. Thus, the insulator 5 covering the signal electrode 3 and the ground electrode 2 are formed without any gap. Accordingly, it is possible to prevent the conductor 8 from flowing through the gap to contact the signal electrode 3 when the conductor 8 is formed after the semiconductor element 7 is mounted. Further, the conductor 8 can be definitely formed on the insulator 5 and the ground electrode 2 without any gap. Accordingly, it is possible to definitely prevent radiation noise from being leaked from the gap between the semiconductor element 7 and the mounting substrate 6 when the semiconductor element 7 is mounted above the mounting substrate 6.

Further, the underfill resin 10 is formed between the semiconductor element 7 and the mounting substrate 6. Accordingly, the contractile force of the underfill resin 10 strengthens the connection states of the bumps 9, and makes the thickness of the bumps 9 small. Therefore, the semiconductor package 1 that is capable of decreasing transmission loss of high-frequency signals can be provided.

Further, according to the manufacturing method of the semiconductor package 1 of the first embodiment, the step part 4 and the insulator 5 are formed in the outer circumferential part of the mounting region S on the mounting substrate 6, which makes it possible to prevent the material forming the underfill resin 10 from flowing outside by the functions of the step part 4 and the insulator 5 serving as dams in the process of forming the underfill resin 10. Accordingly, the conductor 8 is formed on the underfill resin 10 without any gap, which makes it possible to definitely prevent radiation noise from being leaked from the gap between the semiconductor element 7 and the mounting substrate 6.

Further, a simple printed method is used as the method of forming the conductor 8. Thus, the conductor 8 can be formed with a high yield rate, which makes it possible to reduce manufacturing cost of the semiconductor package 1.

Although the first embodiment has been explained with the semiconductor package using the substrate for the semiconductor package (a structure in which one semiconductor element is mounted on the substrate for package) as an example, it is not limited to this. For example, the present invention may be applied to a composite module (a structure in which a plurality of semiconductor elements are mounted on a substrate for module).

(Second Embodiment)

Figure 13:
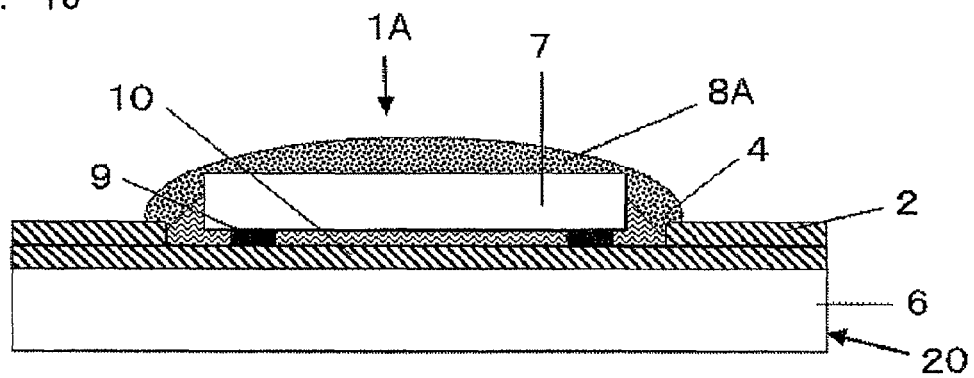
FIG. 13 is a schematic view showing a cross-sectional structure of a semiconductor device according to a second embodiment of the present invention.

FIG. 13 shows an internal structure of a semiconductor package 1A according to a second embodiment of the present invention. FIG. 13 is a cross-sectional view showing a schematic structure of the semiconductor package 1A according to the second embodiment corresponding to FIG. 7. As shown in FIG. 13, the semiconductor package 1A according to the second embodiment differs from the semiconductor package 1 described in the first embodiment above in that a conductor 8A is formed to cover the whole part where a semiconductor element 7 above a mounting substrate 6 is exposed. The other points are similar to those in the first embodiment; the same elements as shown in FIG. 7 are denoted by the same reference symbols, and detailed description thereof will be omitted.

As shown in FIG. 13, in the semiconductor package 1A according to the second embodiment, the conductor 8A that shields radiation noise is formed to cover the whole part where the semiconductor element 7 and the underfill resin 10 above the mounting substrate 6 are exposed. The conductor 8 according to the first embodiment is formed in the closed circular shape in a plane view, whereas the conductor 8A of the semiconductor package 1A according to the second embodiment is formed in a rectangular shape in a plane view.

With the semiconductor package 1A according to the second embodiment, it is possible to prevent radiation noise from being leaked from fine gaps inside the underfill resin 10, the boundary between the underfill resin 10 and the active surface of the semiconductor element 7, and further the upper surface of the semiconductor element 7. Accordingly, radiation noise can be definitely prevented from being leaked from the gap between the semiconductor element 7 and the mounting substrate 6.

Third Embodiment

Figure 14:
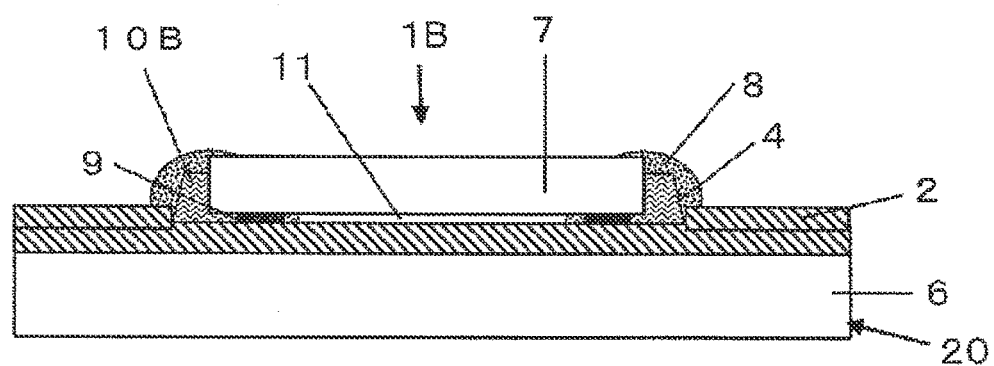
FIG. 14 is a schematic view showing a cross-sectional structure of a semiconductor device according to a third embodiment of the present invention.

FIG. 14 shows an internal structure of a semiconductor package 1B according to a third embodiment of the present invention. FIG. 14 is a cross-sectional view showing a schematic structure of the semiconductor package 1B according to the third embodiment corresponding to FIG. 7. As shown in FIG. 14, the semiconductor package 1B according to the third embodiment differs from the semiconductor package 1 described in the first embodiment above in that an air gap 11 is formed between a semiconductor element 7 and a mounting substrate 6. The other points are similar to those of the first embodiment; the same elements as shown in FIG. 7 are denoted by the same reference symbols, and detailed description thereof will be omitted.

As shown in FIG. 14, the semiconductor package 1B according to the third embodiment has a hollow structure in which the air gap 11 is formed between the semiconductor element 7 and the mounting substrate 6. In the semiconductor package 1B according to the third embodiment, an underfill resin 10B is formed in the connection region of bumps 9 between the semiconductor element 7 and the mounting substrate 6. The underfill resin 10 according to the first embodiment is formed in a rectangular shape in a plane view, whereas the underfill resin 10B of the semiconductor package 1B according to the third embodiment is formed in a closed circular shape in a plane view.

According to the semiconductor package 1B of the third embodiment, the air gap 11 is formed between the semiconductor element 7 and the mounting substrate 6, and a dielectric constant of the air in the air gap 11 is smaller than a dielectric constant of the underfill resin 10 in the first embodiment. By decreasing the conductivity between the semiconductor element 7 and the mounting substrate 6, there occurs no degradation of high frequency characteristic even when the passivation of the semiconductor element 7 is thin. In addition, it is possible to prevent radiation noise from being leaked from a gap between the semiconductor element 7 and the mounting substrate 6 while keeping reliability of the semiconductor element connection.

EXAMPLE

The present inventor has conducted experiments to demonstrate the advantageous effects of the substrate for the semiconductor package according to the present invention. More specifically, a step part is formed in the ground electrodes and an insulator that covers intervals on both sides of the signal electrode and the signal electrode are formed by the manufacturing method of the substrate for the semiconductor package of the present invention to form the electromagnetic shield wall, which demonstrates that the leakage of the radiation noise can be suppressed. In the following description, the experimental results will be described.

EXAMPLE

In the substrate for the semiconductor package according to the example, a pattern of a step part (height of 22 μm) was formed in ground electrodes by the manufacturing method described above based on a printed board having a coplanar waveguide as a mounting substrate. The coplanar waveguide has a thickness of 35 μm, and is mainly formed of PPE with a copper foil. Surface treatment was performed on the surface of the electrode by nickel (thickness of 3 μm) and gold (thickness of 0.5 μm) in this order. A solder resist material (thickness of 20 μm) was used as an insulator that covers the intervals on both sides of the signal electrode and the signal electrode. An element having a size of 4 mm×2 mm×200 μm was used as a semiconductor element. The area of the electromagnetic shield wall in each of the insulator and the step part on the mounting substrate was set to 4.5 mm×2.5 mm.

Based on the substrate for the semiconductor package thus manufactured, a semiconductor package was manufactured as shown below by the manufacturing method of the semiconductor package described above. Gold bumps (diameter of 80 μm) were used as bumps. The flip-chip connection between the mounting substrate and the semiconductor element was performed by Au—Au connection, with pitches of the gold bumps of 150 μm. The underfill resin was formed in a gap between the mounting substrate and the semiconductor element by filling the gap with the material for forming the underfill resin using a dispenser, and then curing it for 30 minutes at the temperature of 150°. The material of the underfill resin is a composite of filler (maximum grain size of 3 μm, and density of 50 wt %) and epoxy resin. Silver paste was formed using a printed method as a conductor.

In a semiconductor package according to a comparative example, a mounting substrate and a semiconductor element were flip-chip connected based on the mounting substrate as is similar to the example described above. The manufacturing process of the semiconductor package according to the comparative example differs from that of the semiconductor package according to the example described above in that the pattern of the step part is not formed in the ground electrodes, and the insulator that covers gaps on both sides of the signal electrode and the signal electrode is not formed.

Then, for the semiconductor packages according to the example and the comparative example, radiation noise in the semiconductor package according to the example was measured based on the comparative example. The result shows that radiation noise can be prevented from being leaked from a gap (beside bumps) between the mounting substrate and the semiconductor element which is the largest source for radiation noise in the semiconductor package.

Figure 15:
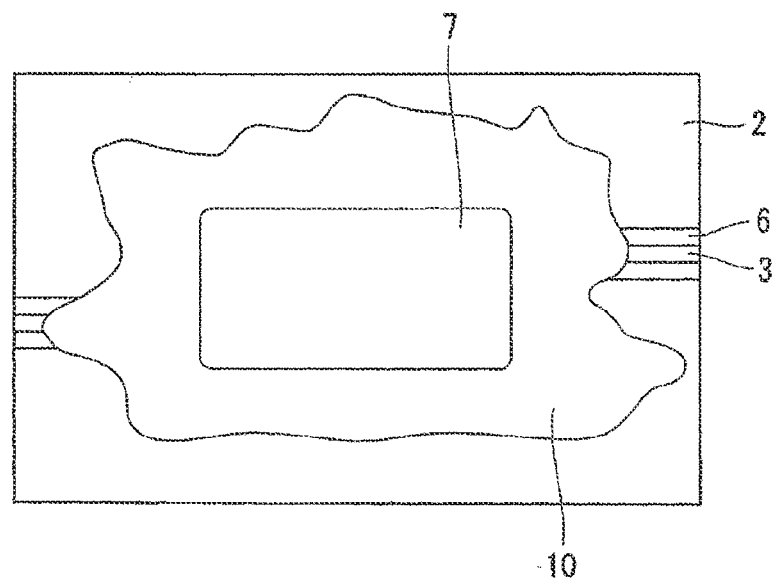
FIG. 15 is a process diagram showing a manufacturing process of a semiconductor package according to a related art as a comparative example.

Further, for the semiconductor packages according to the example and the comparative example, the formation state of the underfill resin in the semiconductor device according to the example was checked based on the comparative example. The result is as follows. In the comparative example, as shown in FIG. 15, the underfill resin has expanded in an irregular shape. Meanwhile, in the example, as shown in FIG. 12, the underfill resin could be formed without flowing out to the outer circumferential part of the mounting region due to the effect of the dams of the step part and the insulator.

Further, for the semiconductor packages according to the example and the comparative example, the formation state of the conductor in the semiconductor package according to the example was checked based on the comparative example. The result is as follows.

Figure 16:
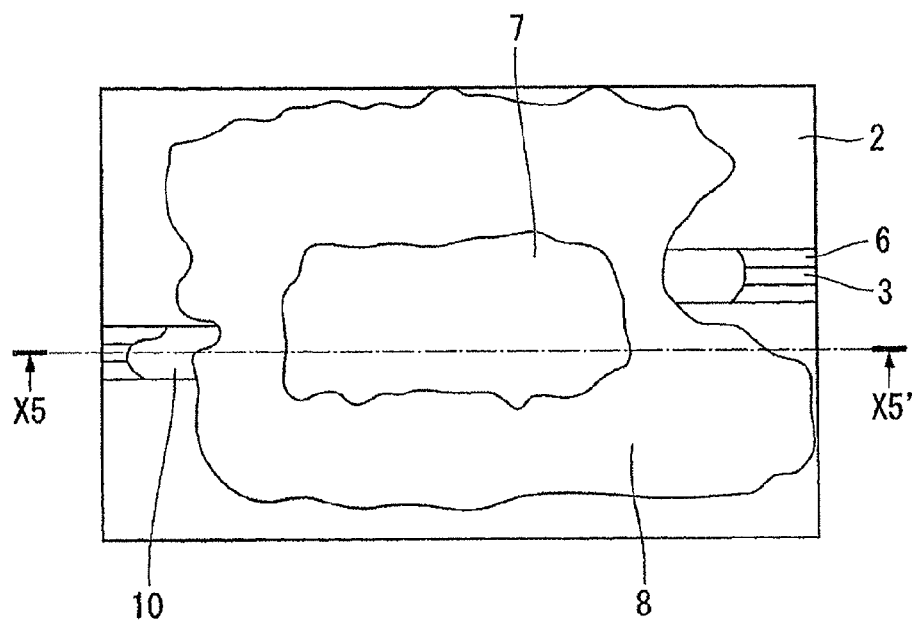
FIG. 16 is a process diagram following FIG. 15.
Figure 17:
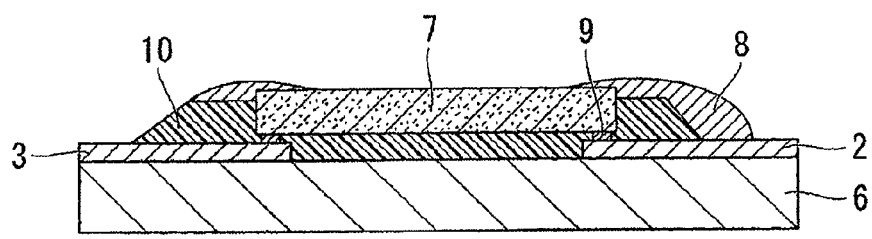
FIG. 17 is a cross-sectional view taken along the line X5-X5' of FIG. 16.
Figure 18:
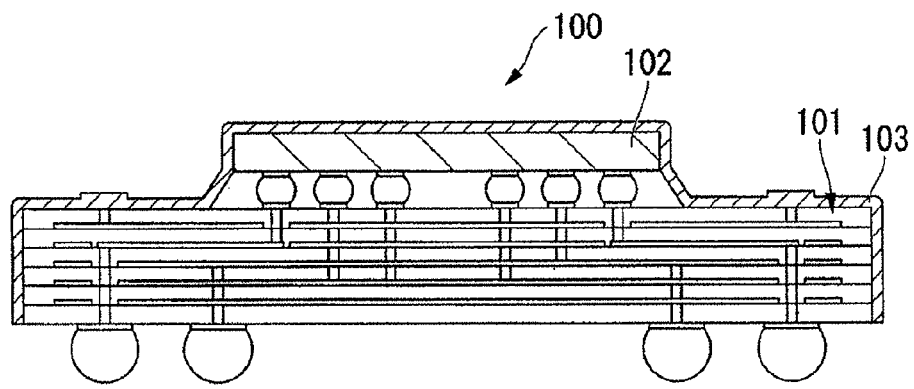
FIG. 18 shows a cross-sectional structure of a semiconductor package according to a patent literature 1.
Figure 19:
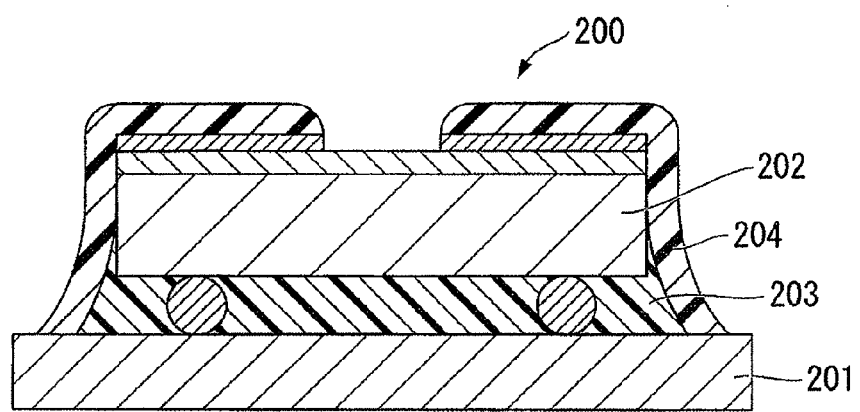
FIG. 19 shows a cross-sectional structure of a semiconductor package according to a patent literature 2.

In the comparative example, as shown in FIGS. 16 and 17 (cross-sectional views taken along the line X5-X5' of FIG. 16), the conductor has expanded to a wide range. Meanwhile, in the example, as shown in FIGS. 6 to 9, the conductor could be formed in a closed circular shape in a plane view without extending to the outer circumferential part of the mounting region.

From the results above, in the comparative example, the underfill resin and the conductor are formed over a wide range, resulting in impedance mismatch in the coplanar waveguide and large signal transmission loss. Meanwhile, in the example, the underfill resin and the conductor are formed without extending to the outer circumferential part of the mounting region. Thus, the transmission loss of the signals can be reduced without generating impedance mismatch in the coplanar waveguide.

While the present invention has been described with reference to the exemplary embodiments, the present invention is not limited to the above description. Various changes that can be understood by a person skilled in the art may be made to the configuration or the detail of the present invention.

This application claims the benefit of priority, and incorporates herein by reference in its entirety, the following Japanese Patent Application No. 2009-168831 filed on Jul. 17, 2009.

Reference Signs List 1, 1A, 1B SEMICONDUCTOR PACKAGE
2 GROUND ELECTRODE
3 SIGNAL ELECTRODE
4 STEP PART
5 INSULATOR
6 MOUNTING SUBSTRATE
7 SEMICONDUCTOR ELEMENT
8 CONDUCTOR
9 BUMP 10 UNDERFILL RESIN
11 AIR GAP
20 SUBSTRATE FOR SEMICONDUCTOR PACKAGE
S MOUNTING REGION
T1 THICKNESS OF GROUND ELECTRODE IN OUTER CIRCUMFERENTIAL PART OF MOUNTING REGION (DISTANCE BETWEEN UPPER SURFACE OF MOUNTING SUBSTRATE AND UPPER SURFACE OF GROUND ELECTRODE IN OUTER CIRCUMFERENTIAL PART OF MOUNTING REGION)
T2 THICKNESS OF GROUND ELECTRODE IN MOUNTING REGION (DISTANCE BETWEEN UPPER SURFACE OF MOUNTING SUBSTRATE AND UPPER SURFACE OF GROUND ELECTRODE IN MOUNTING REGION)
T4 THICKNESS OF INSULATOR (DISTANCE BETWEEN UPPER SURFACE OF MOUNTING SUBSTRATE AND UPPER SURFACE OF INSULATOR)

The invention claimed is:

1. A method of manufacturing a semiconductor package comprising:
    patterning an electrode formed on a mounting substrate having a semiconductor element mounted thereon to form a coplanar waveguide including a signal electrode and ground electrodes arranged on both sides of the signal electrode with intervals therebetween;
    forming a mask on the ground electrode in an outer circumferential part of a mounting region of the semiconductor element and etching the ground electrode in a region where the mask is not formed to form a step part having a larger distance between an upper surface of the mounting substrate and an upper surface of the ground electrode in the outer circumferential part of the mounting region than such distance in the mounting region;
    forming an insulator that covers the signal electrode in the outer circumferential part of the mounting region;
    flip-chip connecting the semiconductor element to the mounting substrate with a bump therebetween to mount the semiconductor element; and
    forming a conductor that fills a gap between the semiconductor element and the mounting substrate based on the ground electrode and the insulator so as not to contact the signal electrode.

2. The method of manufacturing the semiconductor package according to claim 1, comprising filling a gap between the semiconductor element and the mounting substrate with underfill resin after flip-chip connecting the semiconductor element to the mounting substrate with the bump therebetween to mount the semiconductor element and before forming the conductor that fills the gap between the semiconductor element and the mounting substrate based on the ground electrode and the insulator so as not to contact the signal electrode.

3. The method of manufacturing the semiconductor package according to claim 1, comprising forming the conductor by a printed method using conductive paste when forming the conductor that fills the gap between the semiconductor element and the mounting substrate based on the ground electrode and the insulator so as not to contact the signal electrode.

* * * * *